United States Patent [19]
Kuzuhara et al.

[11] Patent Number: 5,272,372
[45] Date of Patent: Dec. 21, 1993

[54] HIGH SPEED NON-VOLATILE PROGRAMMABLE READ ONLY MEMORY DEVICE FABRICATED BY USING SELECTIVE DOPING TECHNOLOGY

[75] Inventors: Masaaki Kuzuhara; Yasuko Hori, both of Tokyo, Japan

[73] Assignee: NEC Corporation, Tokyo, Japan

[21] Appl. No.: 704,254

[22] Filed: May 22, 1991

[30] Foreign Application Priority Data

May 22, 1990 [JP] Japan .................. 2-131794
May 22, 1990 [JP] Japan .................. 2-131795

[51] Int. Cl.$^5$ ............... H01L 29/68; H01L 29/167; H01L 29/80; H01L 29/161
[52] U.S. Cl. ................... 257/608; 257/314; 257/194; 257/280; 257/472
[58] Field of Search ........... 357/23.5, 64; 257/608, 257/609, 610, 314, 192, 194, 280, 472

[56] References Cited

FOREIGN PATENT DOCUMENTS 63-178565 7/1988 Japan .

OTHER PUBLICATIONS

"Semiconductors and Semimetals", vol. 24, Chapter 2, pp. 168-175 (1987).
Hagiwara et al., "A 16 kbit Electrically Erasable PROM Using n-Channel Si-Gate MNOS Technology", IEEE Journal of Solid-State Circuits, vol. SC-15, No. 3, Jun. 1980, pp. 346-353.
Johnson et al., "THPM 12.6: A 16Kb Electrically Erasable Nonvolatile Memory", 1980 IEEE International Solid-State Circuits Conference, pp. 152-153, Feb. 14, 1980.

Primary Examiner—Mark V. Prenty
Attorney, Agent, or Firm—Sughrue, Mion, Zinn, Macpeak & Seas

[57] ABSTRACT

An EEPROM cell is implemented by a field effect transistor comprising a channel layer of an intentionally undoped gallium arsenide, a carrier supplying layer formed on the channel layer and of a heavily doped n-type aluminum gallium arsenide having deep energy level, and a gate electrode formed on the carrier supplying layer, in which the deep energy level causes a current-voltage collapse phenomenon to take place due to trapping hot electrons injected from the channel layer to the carrier supplying layer in the presence of a stress voltage of about 1.2 volts between the source and drain for minimizing channel conductivity and in which the stress voltage of about 3 volts ionizes the deep energy level so as to allow recovering from the current-voltage collapse phenomenon, thereby providing the low and high channel conductivities to two logic levels.

9 Claims, 11 Drawing Sheets

HIGH SPEED NON-VOLATILE PROGRAMMABLE READ ONLY MEMORY DEVICE FABRICATED BY USING SELECTIVE DOPING TECHNOLOGY

FIELD OF THE INVENTION

This invention relates to a non-volatile semiconductor memory device and, more particularly, to the structure of a non-volatile semiconductor memory cell formed by using a selective doping technology on an aluminum-gallium-arsenide/gallium-arsenide heterostructure.

DESCRIPTION OF THE RELATED ART

An EEPROM (Electrically Erasable and Programmable Read Only Memory) cell is classified in either floating gate structure or MNOS (Metal- Nitride- Oxide- Semiconductor) structure. A typical example of the floating gate type EEPROM is proposed by William S. Johnson in "A 16 Kb Electrically Erasable Nonvolatile Memory", 1980 IEEE International Solid-State Circuits Conference, Thursday, Feb. 14, 1980, pages 152 and 153, and T. Hagiwara et. al. proposes a MNOS type EEPROM in "A 16 Kbit Electrically Erasable PROM Using n-Channel Si-Gate MNOS Technology", IEEE Journal of Solid-State Circuits, vol. SC-15, No. 3, June 1980, pages 346 to 353.

FIG. 1 shows the floating gate structure fabricated on a p-type silicon substrate 1. On the p-type silicon substrate 1 is selectively grown a thick field oxide film 2 which defines an active area of the p-type silicon substrate 1. The active area is selectively doped with n-type impurity atoms so that heavily-doped n-type impurity regions 3a and 3b are produced A thin tunnel oxide film 4 covers the heavily-doped n-type impurity region 3b, and a floating gate electrode 5 of polysilicon extends over the thin tunnel oxide film 4. The floating gate electrode 5 is covered with an inter-level oxide film 6 which in turn is overlaid by a control gate electrode 7 of polysilicon.

The floating gate type EEPROM thus fabricated is used for memorizing a bit of data information in the form of electronic charges. The bit of data information is memorized therein and erased therefrom by using hot carriers and Fowler-Nordheim tunneling current. The Fowler-Nordheim tunneling current and the hot carriers pass through the thin tunnel oxide film 4 and allow the floating gate electrode 5 to accumulate and discharge the electronic charges.

On the other hand, the MNOS structure is fabricated from a silicon oxide film grown over that area between two heavily doped n-type regions, a silicon nitride film formed on the silicon oxide film and a polysilicon film provided on the silicon nitride film as shown in the aforementioned paper. Trap levels are introduced at the boundary between two different insulating films, i.e., the silicon oxide film and the silicon nitride film, and a bit of data information is memorized in the form of electronic charges trapped at the boundary In either EEPROM cell the storage characteristics are surely dependent on properties of the boundary between the silicon substrate and the silicon oxide film, and the combination of silicon and silicon oxide provides an acceptable boundary for the EEPROM cell.

However, the prior art EEPROM cells hardly satisfy system composers because of low access speed to bits of data information memorized therein. The carrier mobility inherent in the semiconductor substance is a dominating factor of the access speed, and compound semiconductor is expected to offer a faster EEPROM cell. For example, gallium arsenide is five to six times larger in carrier mobility than silicon. For this reason, an EEPROM in a compound semiconductor system is desirable in view of access speed. However, any insulating material hardly forms an acceptable boundary against a compound semiconductor material, and, thus, a compound semiconductor such as gallium arsenide is not presently applicable to either floating gate structure or MNOS structure.

SUMMARY OF THE INVENTION

It is therefore an important object of the present invention to provide a high-speed electrically erasable and programmable read only memory device which is composed of compound semiconductor materials.

To accomplish the object of the present invention, the present invention proposes to control a channel of a memory transistor through an I-V collapse and recovery therefrom In accordance with one aspect of the present invention, there is provided a non-volatile programmable read only memory device fabricated on a substrate, comprising: a plurality of non-volatile programmable memory cells, wherein each of the non-volatile programmable memory cells comprises a field effect transistor with a selectively doped structure formed of compound semiconductor materials, the selectively doped structure having deep energy level for modulating channel conductivity of the field effect transistor depending upon a stress voltage level between source and drain of the field effect transistor.

In accordance with another aspect of the present invention, there is provided a process of forming a non-volatile programmable read only memory device, comprising the steps of: a) preparing a substrate; b) epitaxially growing a channel layer of a first compound semiconductor material, a carrier supplying layer of a second compound material and a highly conductive layer of a third compound material, the carrier supplying layer having a first predetermined thickness allowing a memory transistor to operate in a depletion mode; c) forming a shallow recess in the highly conductive layer and a deep recess projecting into the carrier supplying layer, the deep recess decreasing the carrier supplying layer to a second predetermined thickness allowing a switching transistor to operate in an enhancement mode, the carrier supplying layer defining the bottom of the shallow recess; d) forming a gate electrode of the memory transistor in the shallow recess and a gate electrode of the switching transistor in the deep recess, the memory transistor and the switching transistor having a selectively doped structure; and e) interconnecting the memory transistor and the switching transistor in series.

In accordance with still another aspect of the present invention, there is provided a process of fabricating a non-volatile programmable read only memory device, comprising the steps of: a) preparing a substrate; b) epitaxially growing a channel layer of a first compound semiconductor material, a carrier supplying layer of a second compound material and a highly conductive layer of a third compound material, the carrier supplying layer having a first predetermined thickness allowing a memory transistor to operate in a depletion mode; c) forming first and second recesses in the highly conductive layer and having respective bottoms defined by the carrier supplying layer; d) selectively growing a fourth compound semiconductor film of a first conductivity type and a fifth compound semiconductor film of a second conductivity type in the second recess for providing a channel of a switching transistor with a metal-semiconductor structure; e) forming a third recess in the fifth compound semiconductor film, the third recess being defined by a portion of the fifth compound semiconductor film which has a thickness allowing the switching transistor to operate in an enhancement mode; f) forming a gate electrode of the memory transistor in the first recess and a gate electrode of the switching transistor in the third recess, the memory transistor having a selectively doped structure; and g) interconnecting the memory transistor and the switching transistor in series.

PRINCIPLE ON WHICH THE PRESENT INVENTION IS BASED

An I-V (Current-Voltage) collapse is observed in an aluminum-gallium-arsenide/gallium arsenide selectively doped structure (see "Anomalies in the Current-Voltage Characteristics" written by H. Morkoc and H. Unlu, Semiconductors and Semimetals, vol. 24, pages 168 to 175, 1987, Academic Press Inc.), and the I-V collapse is known as decrease of channel conductivity by increasing a biasing voltage level. In detail, a channel layer of undoped gallium arsenide is overlaid by an electron supplying layer of aluminum gallium arsenide ($Al_{0.3}Ga_{0.7}As$) doped with $2 \times 10^{18}$ cm$^{-3}$ silicon atoms, and a gate electrode is provided on the electron supplying layer. The n+AlGaAs/i-GaAs selectively doped structure thus produced modulates the channel conductivity with a biasing voltage level at the drain thereof. FIG. 2 shows a normalized channel conductivity in terms of a stress voltage level between the source and drain nodes for the n+AlGaAs/i-GaAs selectively doped structure with a channel length of about 0.25 micron. The n+AlGaAs/i-GaAs selectively doped structure is cooled at 77 degrees Kelvin, and the bias stress is applied for 100 seconds. The normalized channel conductivity is defined as a ratio of a channel conductivity after the application of the bias stress in dark with respect to the channel conductivity without applying any stress voltage. The channel conductivity without any stress voltage level is as large as that in optical radiation. When the stress voltage level is increased from zero to about 1.0 volt, the normalized channel conductivity is decreased to almost zero. This phenomenon, i.e., disappearance of channel conductivity, is well known as "I-V collapse". The I-V collapse is described as follows. Namely, a strong electric field around the drain side of the gate accelerates the electrons injected along the undoped gallium arsenide channel layer, and the hot electrons thus accelerated are transferred to the electron supplying layer and are trapped by a high-density deep energy level (which is referred to as a "DX level", or "DX center" located in the n+aluminum gallium arsenide film. This results in modulation of drain current.

The inventors have researched the I-V collapse, and find that the normalized channel conductivity is gradually recovered from the collapse state after the drain stress voltage level of about 1.6 volts is applied. While the stress voltage level remains between 1.0 volt and 1.4 volts, the normalized channel conductivity continues to be about zero. However, when the stress voltage level exceeds 1.6 volts, the normalized channel conductivity is gradually increased from zero. When the stress voltage level reaches about 3 volts, the normalized channel conductivity is recovered to about 70% of the initial value (see FIG. 2). The inventors explain that a strong electric field due to the large stress voltage ionizes the deep DX level, and the positively ionized deep DX level allows recovering from the I-V collapse. The high channel conductivity takes place in the presence of the stress voltage level at about 3 volts, and the stress voltage level at about 1.2 volts produces the low channel conductivity. Moreover, even when the stress drain voltage level is removed from the selectively doped structure, the low or high channel conductivity is conserved therein in so far as no optical radiation impinges the selectively doped structure. The recovery from the collapse and the conservation of channel conductivity have not been known yet, and are available for fabrication of a new non-volatile programmable read only memory cell.

The present invention is completed on the basis of the applicant's discoveries that the channel conductivity is recovered from the I-V collapse and that the channel conductivity is conserved, and logic "0" level and logic "1" level are assigned to the high and low channel conductivities.

BRIEF DESCRIPTION OF THE DRAWINGS

The features and advantages of the non-volatile programmable read only memory device according to the present invention will be more clearly understood from the following description taken in conjunction with the accompanying drawings in which.

DESCRIPTION OF THE PREFERRED EMBODIMENTS

First Embodiment

Figure 1:
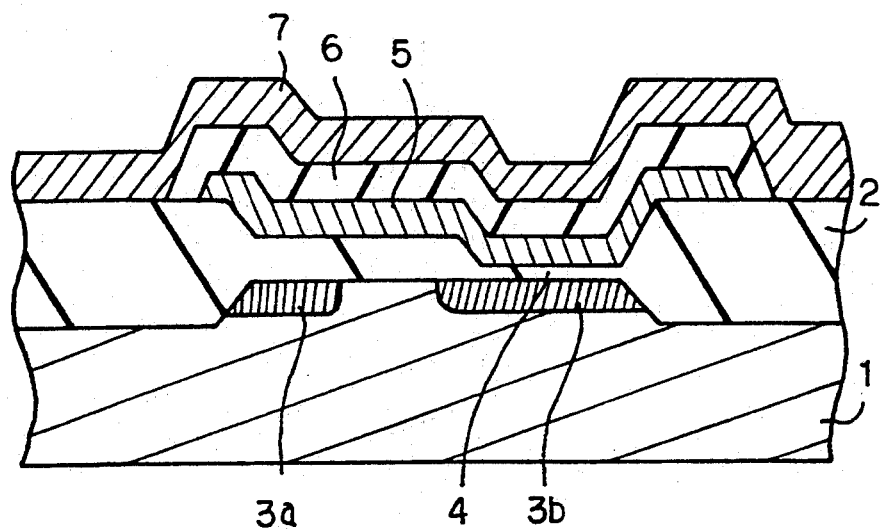
FIG. 1 is a cross sectional view showing the structure of the prior art floating gate type electrically erasable and programmable read only memory device.
Figure 2:
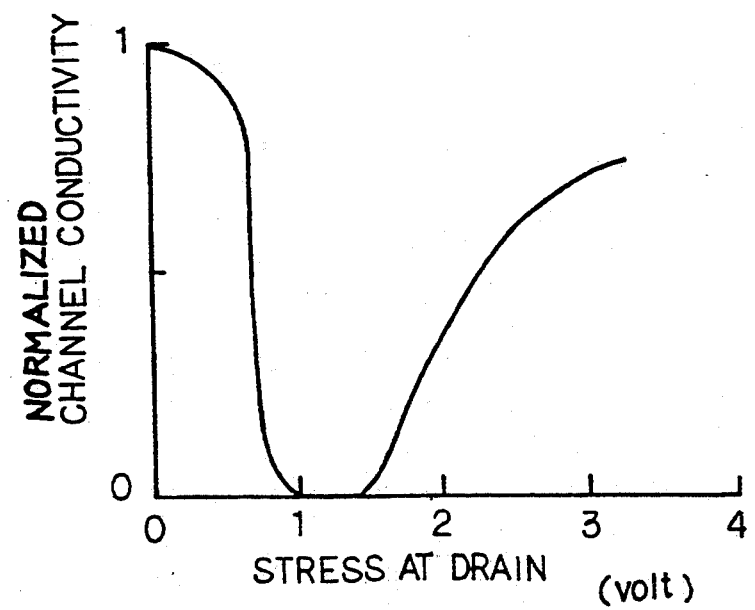
FIG. 2 is a graph showing normalized channel conductivity in terms of stress voltage between the source and drain of a selectively doped structure.
Figure 3:
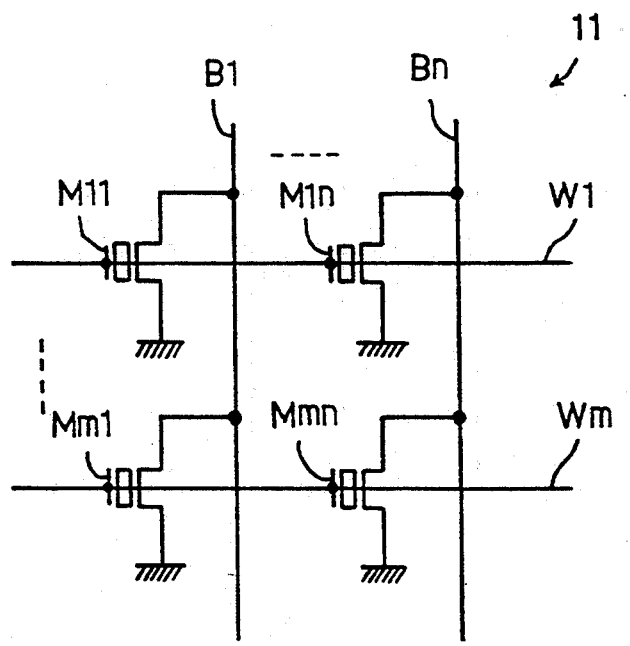
FIG. 3 is an equivalent circuit diagram showing the arrangement of a non-volatile memory cell array incorporated in a non-volatile programmable read only memory device according to the present invention.

Referring to FIG. 3 of the drawings, a memory cell array 11 incorporated in a non-volatile programmable read only memory device embodying the present invention comprises a plurality of non-volatile programmable memory cells M11, M1n, Mm1 and Mmn arranged a matrix, a plurality of word lines W1 to Wm respectively coupled to the rows of the non-volatile programmable memory cells M11 to Mmn, a plurality of bit lines B1 to Bn respectively coupled to the columns of the non-volatile programmable memory cells M11 to Mmn. Though not shown in the drawings, the memory cell array 11 is associated with peripheral circuits such as a row address decoder for selectively driving the word lines W1 to Wm, a column selector for interconnecting one of the bit lines B1 to Bn and a sense amplifier, an output buffer, and a data write-in circuit.

Each of the non-volatile programmable memory cells M11 to Mmn is coupled between the associated bit line B1 or Bn and a ground line, and the channel region thereof has either high or low conductivity depending upon a data bit memorized therein. In the following description, the high and low conductivities are indicative of logic "1" level and logic "0" level, respectively, and a data bit of logic "0" level is tantamount to an erased state. Each of the word lines W1 to Wm is coupled to the gate electrodes of the associated non-volatile programmable memory cells M11 to Mmn, and supplies an active level to the gate electrodes of the associated non-volatile programmable memory cells M11 to Mmn. If the non-volatile programmable memory cells M11 to Mmn have the low conductivity, any conductive channels do not take place in the presence of the active level. However, the active level allows the non-volatile programmable memory cells with the high conductivity M11 to Mmn to turn on, and current flows from the associated bit lines to the ground line. With the row address decoder and the column selector, one of the non-volatile programmable memory cells M11 to Mmn is selected from the memory cell array 11. If the selected non-volatile programmable memory cell has the high conductivity, the current is detected by the sense amplifier, and the output buffer supplies an output data signal of logic "1" level to an external circuit. On the other hand, if the selected non-volatile programmable memory cell has the low conductivity, no current is detected by the sense amplifier, and the output buffer shifts the output data signal to logic "0" level.

Figure 4:
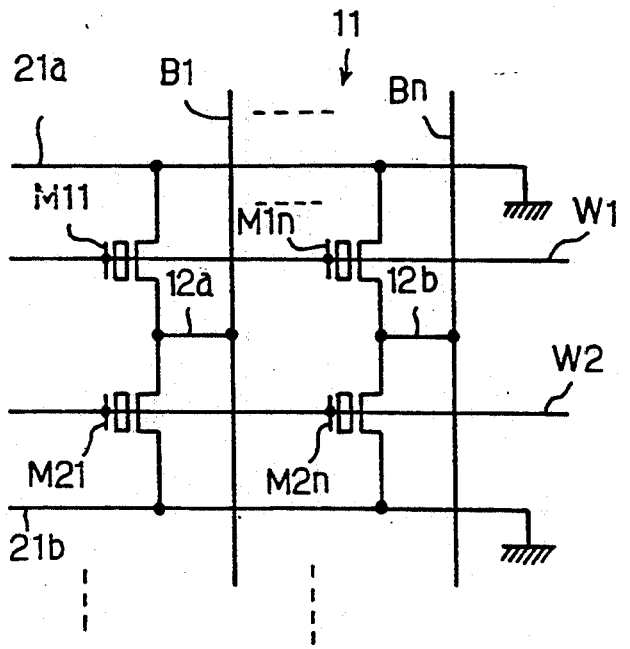
FIG. 4 is a diagram showing the layout of an array of the non-volatile programmable memory cells shown in FIG. 3.

FIG. 3 shows the equivalent circuit of the memory cell array 11; however, the memory cell array 11, the word lines W1 to Wm and the bit lines B1 to Bn are arranged as shown in FIG. 4. Namely, two of the non-volatile programmable memory cells M11 and M21, or M1n and M2n are coupled to the associated bit line B1 to Bn through an inter-level wiring 12a or 12b passing through a contact window (not shown). The arrangement shown in FIG. 4 enhances integration density of the non-volatile programmable read only memory device, because the number of contact holes is decreased rather than an arrangement where every non-volatile programmable memory cell is coupled to the associated bit line through a contact hole formed in an inter-level insulating film.

Figure 5:
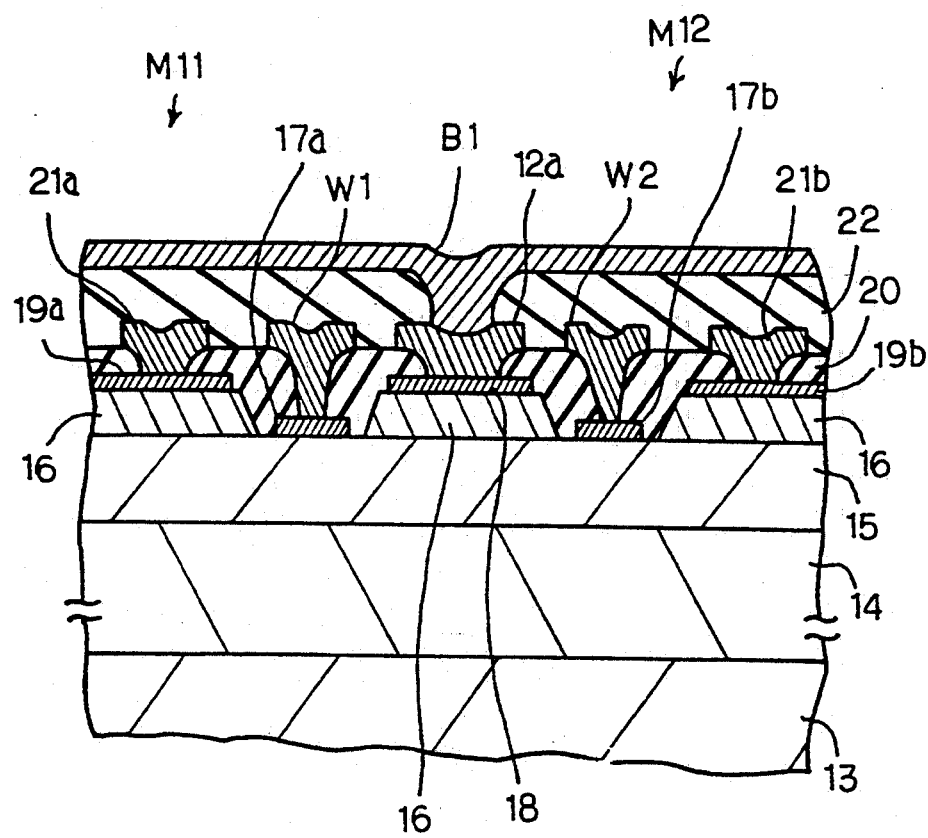
FIG. 5 is a cross sectional view showing the structure of the non-volatile programmable memory cells forming a part of the array.

Turning to FIG. 5 of the drawings, the non-volatile programmable read only memory device is fabricated on a semi-insulating gallium arsenide substrate 13. A channel layer 14 of high-purity intentionally undoped gallium arsenide is formed over the semi-insulating gallium arsenide substrate 13, and is about 200 nanometers in thickness. On the channel layer 14 is epitaxially grown an electron supplying layer 15 which is formed of heavily doped n-type aluminum gallium arsenide doped with silicon atoms at $2 \times 10^{18}$ cm$^{-3}$. In this instance, the electron supplying layer 15 is of the order of 50 nanometers, and the aluminum gallium arsenide has chemical composition represented as $Al_{0.3}Ga_{0.7}As$. The channel layer 14 and the electron supplying layer 15 form in combination a selectively doped structure of compound semiconductor materials.

The electron supplying layer 15 is partially overlaid by heavily doped n-type gallium arsenide blocks 16, and recesses are defined by the heavily doped n-type gallium arsenide blocks 16 for exposing the electron supplying layer 15. The heavily doped n-type gallium arsenide blocks 16 are also doped with silicon atoms of about $3 \times 10^{18}$ cm$^{-3}$ and are about 80 nanometers in thickness. The channel layer 14, the electron supplying layer 15 and a heavily doped n-type gallium arsenide layer are epitaxially grown by using a molecular beam epitaxy or a metal organic chemical vapor deposition technique, and the recesses are formed in the heavily doped n-type gallium arsenide layer through a lithographic process followed by an etching stage. The etching stage is constituted by either a wet or dry etching process, and a solution containing phosphoric acid ($H_3PO_4$) or a gaseous mixture containing chlorine ($Cl_2$) is used as an etchant in the etching stage.

On the electron supplying layer 15 exposed to the recesses are formed gate electrodes 17a and 17b which are formed of titanium-aluminum alloy (Ti-Al). Namely, the titanium-aluminum alloy is deposited over the entire surface, and is patterned by using a photo-lithographic system or an electron beam exposure system. The titanium-aluminum alloy film is selectively removed, and the gate electrodes 17a and 17b are provided on the exposed surface of the electron supplying layer 15. In this instance, the channel length is adjusted to about 0.25 microns.

A common drain electrode 18 and source electrodes 19a and 19b are formed on the heavily doped n-type gallium arsenide layer 16, and are formed of gold-germanium-nickel alloy (Au-Ge-Ni). The gold-germanium-nickel alloy is deposited through an evaporation technique, and is, then, patterned to form the common drain electrode 18 and the source electrodes 19a and 19b. The gold-germanium-nickel alloy plates 18, 19a and 19b are annealed at 420 degrees centigrade. The channel layer 14, the electron supplying layer 15, the heavily doped n-type gallium arsenide layer 16, the gate electrodes 17a and 17b, the common drain electrode 18 and the source electrodes 19a and 19b form a field effect transistor with a selective doping structure serving as the non-volatile programmable memory cells M11 and M12. The field effect transistors are operative in the depletion mode with a threshold voltage level of about $-0.8$ volts.

A first inter-level insulating film 20 of silicon dioxide is deposited over the entire surface of the structure, and contact holes are formed in the first inter-level insulating film 20 so that the gate electrodes 17a and 17b, the common drain electrode 18 and the source electrodes 19a and 19b are exposed. A mask pattern is formed on the first inter-level insulating film 20 through a lithographic process, and a conductive material such as titanium-platinum-gold or aluminum is deposited over the entire surface. When the mask pattern is lifted off, ground lines 21a and 21b, the word lines W1 and W2 and the inter-level wiring 12a are left on the first inter-level insulating film 20.

A second inter-level insulating film 22 of silicon dioxide is deposited over the entire surface of the structure, and a contact hole is formed over the inter-level wiring 12a. A mask pattern is formed on the second inter-level insulating film 22 again, and a conductive material such as titanium-platinum-gold or aluminum is deposited over the second inter-level insulating film 22. The mask pattern is lifted off, and the bit line B1 is left on the second inter-level insulating film 22.

The non-volatile programmable read only memory device thus arranged is cooled at about 77 degrees Kelvin, and is used in a light-free environment. However, the non-volatile programmable read only memory device is operable at a different temperature in so far as the different temperature is not higher than 150 degrees Kelvin. In order to establish the erased state in the non-volatile programmable memory cell M11, the word line W1 and the bit line B1 is applied with about 0.5 volt and about 1.5 volts, respectively, and strong electric field extending from the common drain electrode 18 allows hot electrons to be injected into the electron supplying layer 15 of aluminum gallium arsenide. The hot electrons are trapped by high-density deep energy level DX, and the I-V collapse takes place. This results in the low channel conductivity, and the non-volatile programmable memory cell M11 enters the erased state. The non-volatile programmable memory cell M11 thus established in the erased state memorizes a data bit of logic "0" level.

If the word line W1 and the bit line B1 are applied with about 0.5 volts and about 3.5 volts, respectively, the high-density deep energy level DX is ionized, and the field effect transistor with the selectively doped structure is recovered from the I-V collapse. This results in the non-volatile programmable memory cell M11 entering the high conductivity state again, and a data bit of logic "1" level is memorized in the non-volatile programmable memory cell M11.

When the data bit is read out from the non-volatile programmable memory cell M11, the word line W1 is driven to the active level of about 0.5 volts, and the bit line B1 is applied with about 0.5 volts. If the data bit memorized therein is logic "1" level, the non-volatile programmable memory cell M11 has entered the high conductivity state, and current flows from the bit line B1 to the ground line 21a. However, if the data bit is logic "0" level, no current flows across the non-volatile programmable memory cell M11. Since non-selected word lines W2 to Wm remain under the threshold voltage level of −0.8 volts, and the non-volatile programmable memory cells have no influence on the voltage level at the associated bit lines B1 to Bn. As described hereinbefore, the sense amplifier checks the bit line B1 to see whether or not the current flows, and the output buffer supplies the output data signal to the external circuit.

As will be understood from the foregoing description, the non-volatile programmable memory cell according to the present invention memorizes a data bit by virtue of the selectively doped structure of compound semiconductor materials. Since the non-volatile programmable memory cells have respective channels formed of the high-purity intentionally undoped gallium arsenide, the access speed to the data bit is drastically improved. In the first embodiment, each of the non-volatile programmable memory cells is implemented by a single field effect transistor, the high integration density memory cell array 11 is realized on a small substrate 13, and is desirable for an ultra large scale integration.

Second Embodiment

Figure 6:
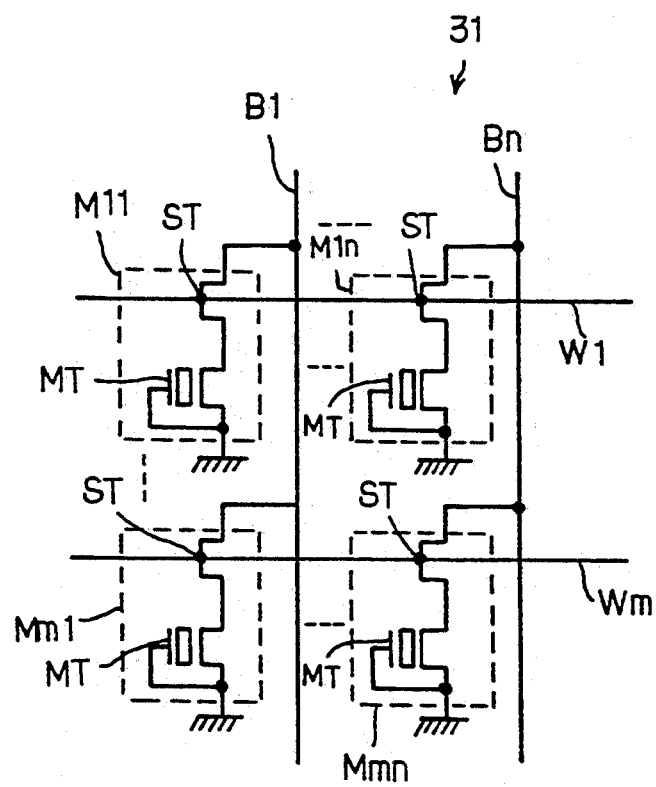
FIG. 6 is an equivalent circuit diagram showing the arrangement of another non-volatile programmable read only memory device according to the present invention.

Turning to FIG. 6 of the drawings, a memory cell array 31 incorporated in another non-volatile programmable read only memory device is illustrated. The memory cell array 31 is formed by a plurality of non-volatile programmable memory cells M11, M1n, Mn1 and Mmn arranged in rows and columns, and is associated with a plurality of word lines W1 to Wm as well as a plurality of bit lines B1 to Bn. Although peripheral circuits are provided in association with the memory cell array 31 similarly to the first embodiment, no detailed description is incorporated hereinbelow, because these peripheral circuits do not directly concern the gist of the present invention.

Figure 7:
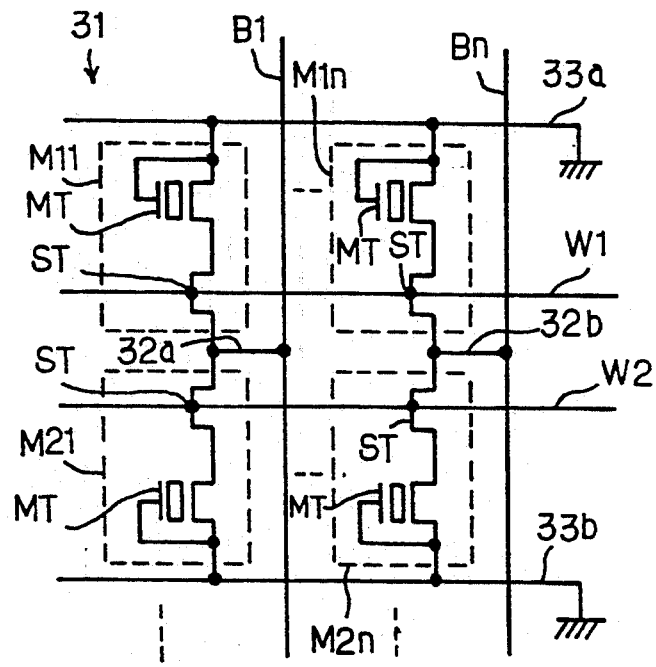
FIG. 7 is a diagram showing the layout of an array of the non-volatile programmable memory cells shown in FIG. 6.

Every two non-volatile programmable memory cells M11 and M21, or M1n and M2n of the memory cell array 31 are coupled to the associated bit line B1 or Bn through an inter-level wiring 32a or 32b as shown in FIG. 7, and the rows of the non-volatile programmable memory cells are coupled to ground lines 33a and 33b, respectively. The layout shown in FIG. 7 enhances the integration density of the memory cell array 31 because of a small number of contact holes.

Each of the non-volatile programmable memory cells M11 to Mmn is implemented by a series combination of a switching transistor ST and a memory transistor MT coupled between the inter-level wiring 32a or 32b and the associated ground line 33a or 33b, and the switching transistor ST is gated by the associated word line W1 or W2. Each of the non-volatile programmable memory cells M11 to Mmn has a gate electrode coupled to the source electrode thereof as shown in FIGS. 6 and 7.

In detail, the memory cell array 31 is fabricated on a semi-insulating gallium arsenide substrate 34, and a channel layer 35 of high-purity intentionally undoped gallium arsenide is grown over the semi-insulating substrate 34. The channel layer 35 is about 200 nanometers in this instance. On the channel layer 35 is grown an electron supplying layer 36 which is formed of heavily doped n-type aluminum gallium arsenide ($Al_{0.3}Ga_{0.7}As$). The n-type aluminum gallium arsenide is doped with silicon atoms of about $2 \times 10^{18}$ cm$^{-3}$ and is about 50 nanometers in thickness. The electron supplying layer 36 is partially covered with heavily doped n-type gallium arsenide blocks 37 which is also doped with silicon atoms of about $3 \times 10^{18}$ cm$^{-3}$. Each of the heavily doped n-type gallium arsenide blocks 37 is of the order of 80 nanometers in thickness. Since source portions of the electron supplying layer 36 are slightly etched away, the heavily doped n-type gallium arsenide blocks 37 define deep recesses as well as shallow recesses, and gate electrodes of titanium-aluminum alloy 38a, 38b, 38c and 38d are held in contact with the exposed electron supplying layer 36 in the deep and shallow recesses. The gate electrodes 38b and 38c form parts of the switching transistors ST of the non-volatile programmable memory cells M11 and M12, and the gate electrodes 38a and 38d are used for the memory transistors MT. In this instance, the channel length of each of the switching transistor ST and the memory transistor MT is about 0.25 microns. Since the gate electrodes 38b and 38c are provided on the thin portions of the electron supplying layer 36, the switching transistors ST are operative in an enhancement mode, and the threshold voltage is about 0.2 volts. However, the gate electrodes 38a and 38d on the thick portions allow the memory transistors MT to operate in a depletion mode, and the threshold voltage level is about −1.4 volts.

Source and drain electrodes of gold-germanium-nickel (Au-Ge-Ni) 39a, 39b, 39c, 39d and 39e are held in contact with the heavily doped n-type gallium arsenide blocks 37, respectively, and a first inter-level insulating film 40 of silicon dioxide covers the gate electrodes 38a to 38d and the source and drain electrodes 39a to 39e. Contact holes are formed in the first inter-level insulating film 40, and the ground lines 33a and 33b, the inter-level wiring 32a and the word lines W1 and W2 are brought into contact with the source electrodes 39a and 39e, the drain electrode 39c and the gate electrodes 38b and 38c, respectively. Though not shown in the drawings, the gate electrodes 38a and 38d are coupled to the source electrodes 39a and 39e, respectively.

A second inter-level insulating film 41 covers the first inter-level insulating film 40, the ground lines 33a and 33b, the word lines W1 and W2 and the inter-level wiring 32a, and a contact hole allows the bit line B1 to contact with the inter-level wiring 32a. In this instance, the ground lines 33a and 33b, the word lines W1 and W2, the inter-level wiring 32a and the bit line B1 are formed of titanium-platinum-gold alloy; however, aluminum may be available for those wirings.

The non-volatile programmable read only memory device thus arranged is cooled at about 77 degrees Kelvin, and is used in a light-free environment. However, the non-volatile programmable read only memory device is operable at a different temperature in so far as the different temperature is not higher than 150 degrees Kelvin.

In order to establish the erased state in the non-volatile programmable memory cell M11, the word line W1 and the bit line B1 is applied with about 0.5 volts and about 1.5 volts, respectively, and strong electric field extending from the common drain electrode 39c allows hot electrons to be injected into the electron supplying layer 36 for the memory transistor MT. The hot electrons are trapped by high-density deep energy level DX, and the I-V collapse takes place. This results in the low channel conductivity, and the non-volatile programmable memory cell M11 enters the erased state. The non-volatile programmable memory cell M11 thus established in the erased state memorizes a data bit of logic "0" level.

If the word line W1 and the bit line B1 are applied with about 0.5 volt and about 3.5 volts, respectively, the high-density deep energy level DX is ionized, and the memory transistor MT with the selectively doped structure is recovered from the I-V collapse. This results in the non-volatile programmable memory cell M11 entering the high conductivity state again, and a data bit of logic "1" level is memorized in the non-volatile programmable memory cell M11.

When the data bit is read out from the non-volatile programmable memory cell M11, the word line W1 is driven to the active level of about 0.5 volts, and the bit line B1 is applied with about 0.5 volts. If the data bit memorized therein is logic "1" level, the non-volatile programmable memory cell M11 has entered in the high conductivity state, and current flows from the bit line B1 to the ground line 33a. However, if the data bit is logic "0" level, no current flows across the non-volatile programmable memory cell M11. Since non-selected word lines W2 to Wm remain under zero or a negative voltage level, these non-volatile programmable memory cells have no influence on the voltage level at the associated bit lines B1 to Bn. As described hereinbefore, the sense amplifier checks the bit line B1 to see whether or not the current flows, and the output buffer supplies the output data signal to the external circuit as similar to the first embodiment.

As will be understood from the foregoing description, the non-volatile programmable memory cell according to the present invention memorizes a data bit by virtue of the selectively doped structure of compound semiconductor materials. Since the non-volatile programmable memory cells have respective channels formed of the high-purity intentionally undoped gallium arsenide, the access speed to a data bit is drastically improved.

In the second embodiment, each of the non-volatile programmable memory cells is implemented by a series combination of the switching transistor ST and the memory transistor MT, and both of the transistors ST and MT have the selectively doped structure. If the switching transistor ST is of the selectively doped type, the I-V collapse may take place in the switching transistor ST in the erasing operation with the drain biasing volta of about 1.5 volts and the gate biasing voltage of 0.5 volts on the associated word line. However, a wide channel width prevents the switching transistor ST from the undesirable I-V collapse, because the wide channel width decreases current density in the channel of the switching transistor ST.

Description is hereinbelow made on a process sequence for fabricating the non-volatile programmable memory cell shown in FIG. 8 with reference to FIGS. 9A to 9F. The process sequence starts with preparation of the semi-insulating gallium arsenide substrate 34, and a high purity intentionally undoped gallium arsenide film 91, a heavily doped n-type aluminum gallium arsenide film 92 and a heavily doped n-type gallium arsenide film 93 are epitaxially grown on the semi-insulating gallium arsenide substrate 34 by using a molecular beam epitaxy or a metal organic chemical vapor deposition. The high purity intentionally undoped gallium arsenide film 91 serves as the channel layer 35, and the thickness of the heavily doped n-type aluminum gallium arsenide film 92 is regulate to the predetermined value preferable for a depletion type field effect transistor. In this instance, the predetermined value is about 50 nanometers. The resultant structure of this stage is illustrated in FIG. 9A.

Figure 9A:
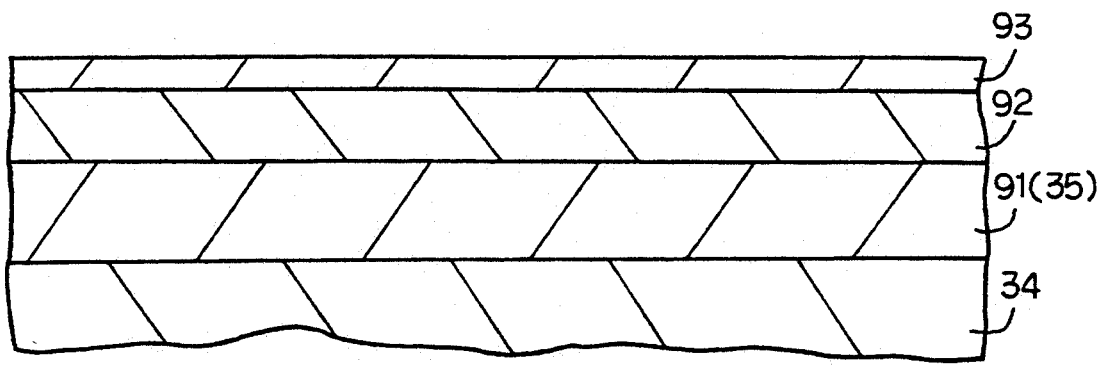
FIGS. 9A to 9F are cross sectional views showing the sequence of a process for fabricating the non-volatile programmable read only memory device shown in FIG. 8.
Figure 9B:
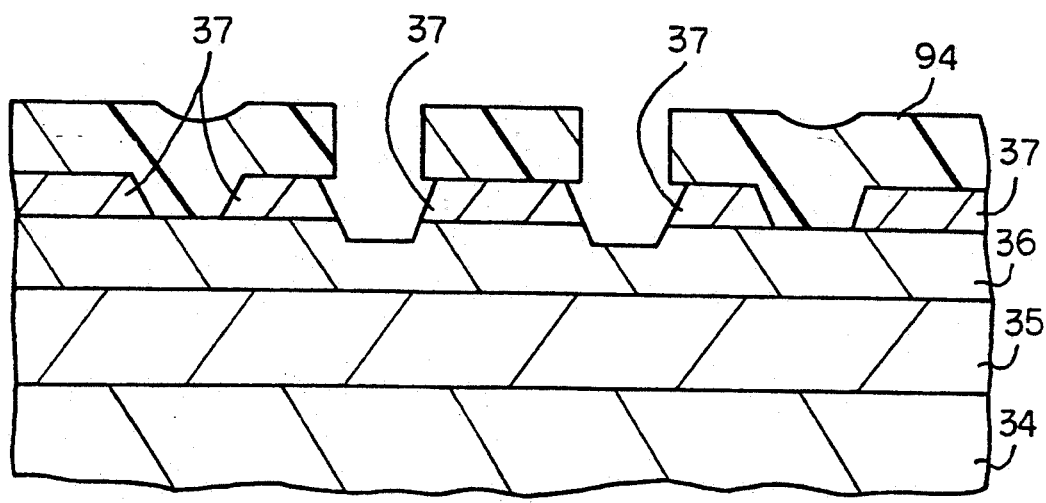

A photo-resist solution is spun onto the entire surface of the structure so as to form a photo-resist film, and the photo-resist film is patterned through lithographic techniques so that a photo-mask layer is provided on the heavily doped n-type gallium arsenide film 93. The photo-mask layer exposes all of the recess forming regions to an etchant, and the heavily doped n-type gallium arsenide film 93 is selectively removed until the heavily doped n-type aluminum gallium arsenide film 92 appears. The photo-mask layer is, then, stripped off, and a photo-mask layer 94 is formed on the heavily doped n-type gallium arsenide film 93 again. The photo-mask layer 94 covers the shallow recesses, and exposes the other heavily doped n-type aluminum gallium arsenide film to the etchant again. The etchant partially removes the heavily doped n-type aluminum gallium arsenide film, and forms the deep recesses as shown in FIG. 9B. Either dry or wet etching is used for forming the shallow and deep recesses, and a solution containing phosphoric acid ($H_3PO_4$) or a gaseous mixture containing chlorine ($Cl_2$) is used as an etchant in the etching stage. The heavily doped n-type aluminum gallium arsenide film 92 thus slightly removed serves as the electron supplying layer 36, and the thin portions of the electron supplying layer 36 allow the switching transistors ST with the selectively doped structure to be operative in the enhancement mode. The heavily doped n-type gallium arsenide left on the electron supplying layer 36 provides the heavily doped n-type gallium arsenide blocks 37.

Figure 9C:
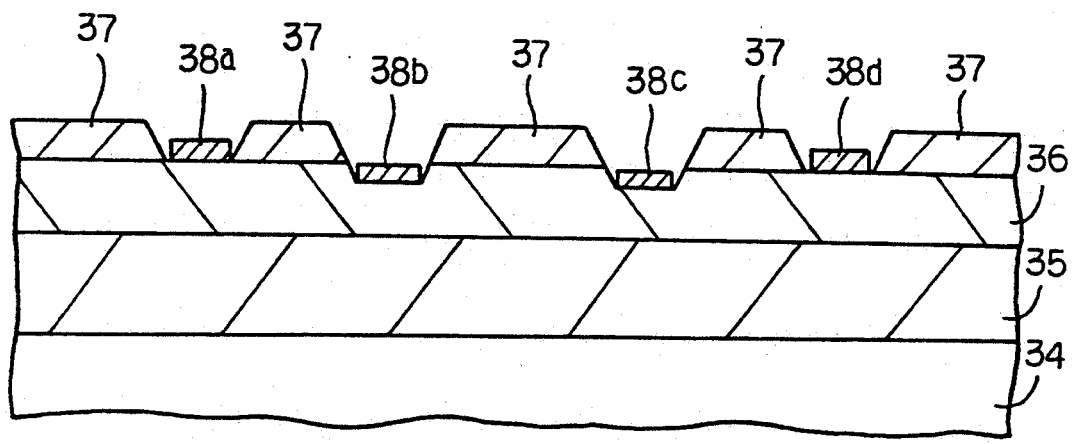

The photo-mask layer 94 is stripped off, and titanium-aluminum alloy is deposited over the entire surface of the structure. An appropriate photo-mask layer is formed on the titanium-aluminum alloy film, and the titanium-aluminum alloy film is selectively removed through an etching process. Then, the gate electrodes 38a to 38d are left on the bottom surfaces of the deep and shallow recesses. Since the gate width is on the sub-micron order, an electron beam exposing system may be used for forming the gate electrodes 38a to 38d. The resultant structure of this stage is shown in FIG. 9C.

Figure 9D:
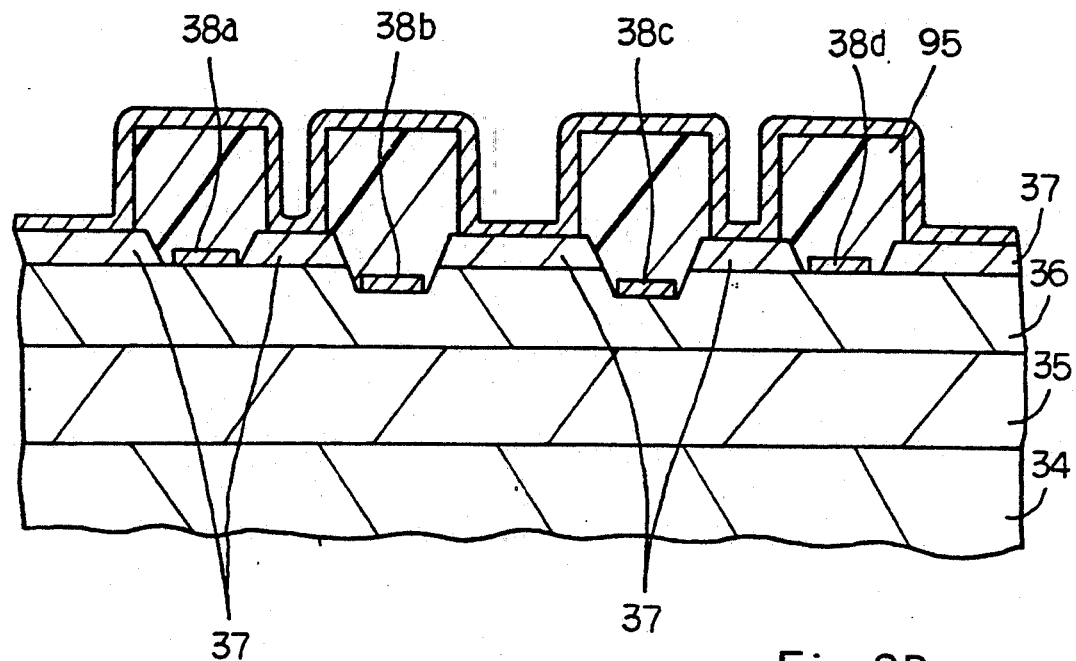

A photo-resist solution is spun onto the entire surface of the structure to form a photo-resist film, and the photo-resist film is patterned to form a photo-resist mask layer 95. The photo-resist mask layer 95 covers the gate electrodes 38a to 38d and exposes predetermined regions where the source and drain electrodes 39a to 39e are formed. Gold-germanium-nickel alloy is deposited over the entire surface of the structure by using an evaporation technique as shown in FIG. 9D, and the photo-resist mask layer 95 is stripped off. The gold-germanium-nickel alloy on the entire surface of the photo-resist mask layer 95 is removed from the structure together with the photo-resist mask layer 95, and the source and drain electrodes 39a to 39e are left on the heavily doped n-type gallium arsenide blocks 37. The gold-germanium-nickel plates are subjected to a heat treatment at about 420 degrees centigrade.

Figure 9E:
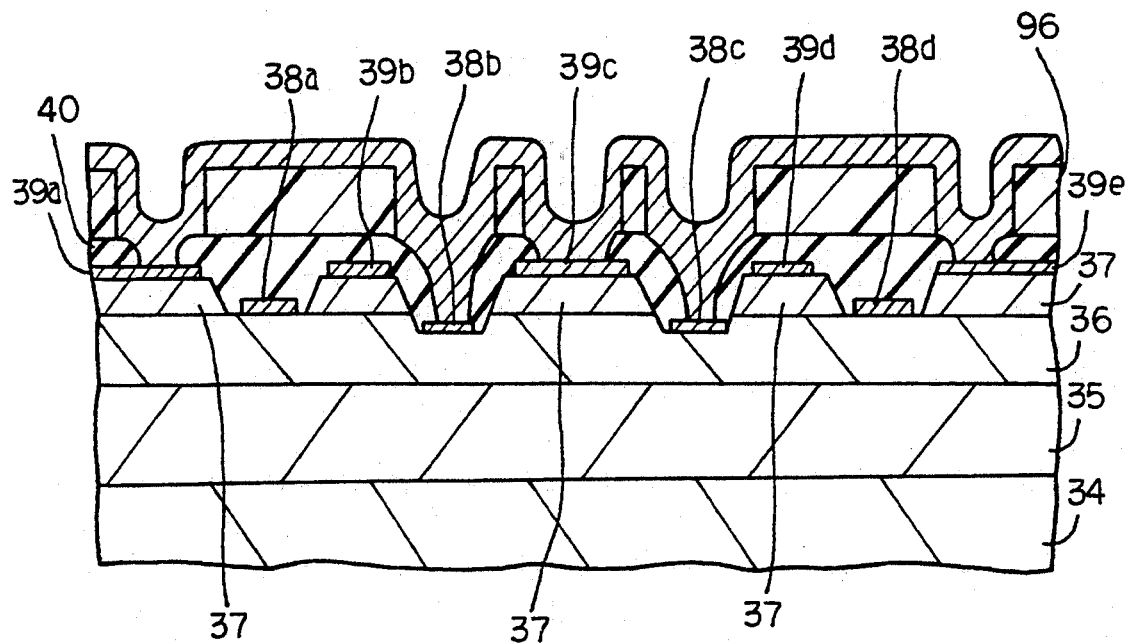

Silicon dioxide is deposited over the entire surface of the structure, and the silicon dioxide film provides the first inter-level insulating film 40. An appropriate mask layer is formed on the silicon dioxide film through a lithographic process, and contact holes are formed in the first inter-level insulating film 40. The contact holes project through the first inter-level insulating film 40 and reach the source and drain electrodes 39a, 39c and 39e as well as the gate electrodes 38b and 38c. The mask layer for the contact holes are stripped off, and a photo-resist solution is spun onto the entire surface again to form a photo-resist film. The photo-resist film is patterned to form a photo-resist mask layer 96, and the photo-resist mask layer 96 exposes predetermined regions where the ground lines 33a and 33b, the word lines W1 and W2 and the inter-level wiring 32a are formed. Titanium-platinum-gold alloy is deposited over the entire surface of the structure through an evaporation process as shown in FIG. 9E. The photo-resist mask layer 96 is stripped off together with the titanium-platinum-gold alloy held in contact with the mask layer 96, and the ground lines 33a and 33b, the word lines W1 and W2 and the inter-level wiring 32a are left on the first inter-level insulating film 40.

Figure 9F:
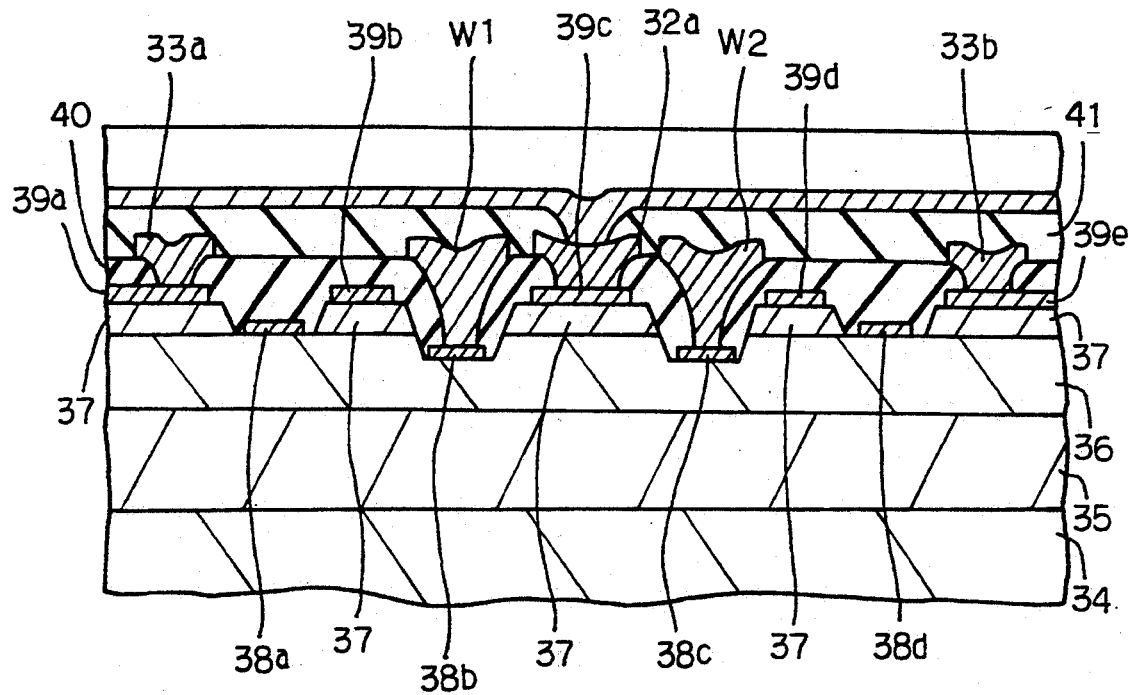

Silicon dioxide is deposited over the entire surface of the structure again, and the silicon dioxide forms the second inter-level insulating film 41. The second inter-level insulating film 41 is selectively removed through the lithographic process, and a contact hole is formed in the second inter-level insulating film 41. The contact hole projects through the second inter-level insulating film 41 and reaches the inter-level wiring 32a. A photo-resist mask layer for a lift-off stage is formed on the second inter-level insulating film 41, and the titanium-platinum-gold is deposited over the entire surface as shown in FIG. 9F. When the photo-resist mask layer is lifted off, the bit line B1 is left on the second inter-level insulating film 41.

Figure 8:
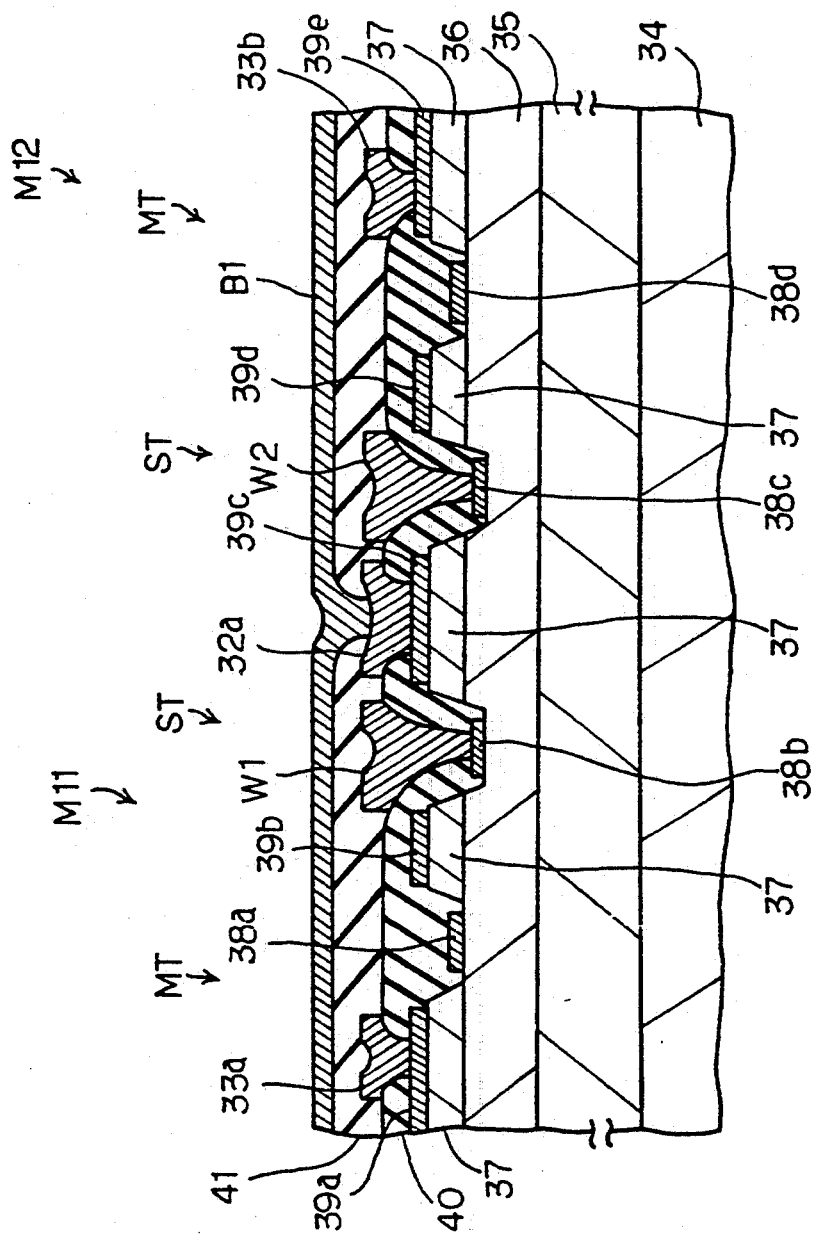
FIG. 8 is a cross sectional view showing the structure of the non-volatile programmable memory cells forming a part of the array incorporated in the non-volatile programmable read only memory device shown in FIG. 6.

The non-volatile programmable read only memory device shown in FIG. 8 achieves a high-speed access as similar to the first embodiment, and the process sequence for the non-volatile programmable read only memory device is relatively simple.

Third Embodiment

Figure 10:
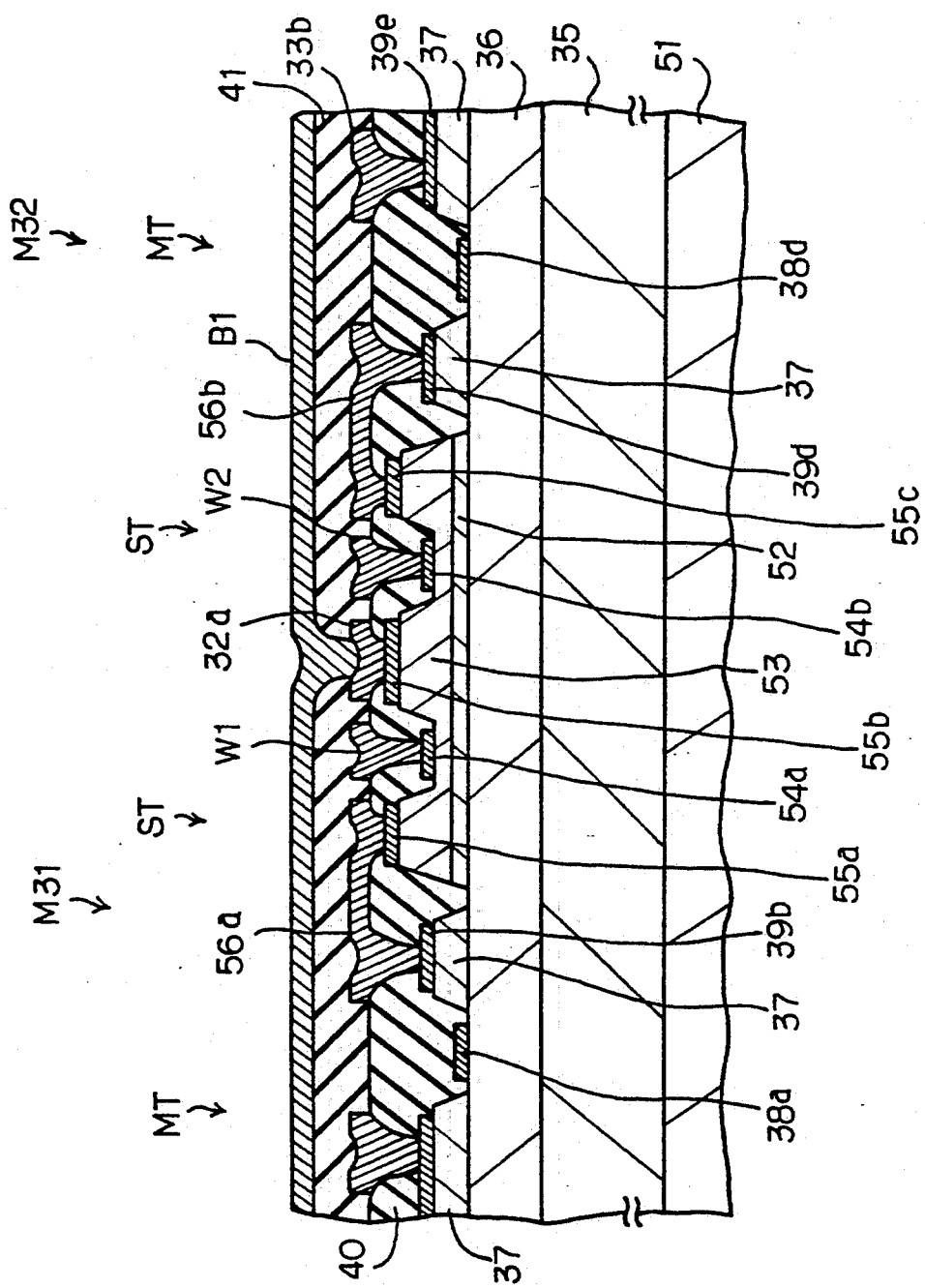
FIG. 10 is a cross sectional view showing the structure of non-volatile programmable memory cells incorporated in still another non-volatile programmable read only memory device according to the present invention.

Turning to FIG. 10 of the drawings, non-volatile programmable memory cells M31 and M32 incorporated in another non-volatile programmable read only memory device is fabricated on a semi-insulating gallium arsenide substrate 51. Each of the non-volatile programmable memory cells M31 and M32 is implemented by a series combination of a switching transistor ST and a memory transistor MT, and the memory transistor MT is similar in structure to that of the second embodiment. For this reason, the same references are used for designating the components of the memory transistor MT corresponding to those of the second embodiment. Description is focused upon the switching transistors ST only.

On the electron supplying layer 36 is formed a p-type gallium arsenide film 52 which is overlaid by an n-type gallium arsenide film 53. The n-type gallium arsenide film 53 is partially removed to form recesses, and the depth of each recess is adjusted to a certain value for forming an enhancement mode MES (Metal-Semiconductor) type field effect transistor. In the recesses gate electrodes 54a and 54b are formed in contact with the thin portions of the n-type gallium arsenide film 53, and source and drain electrodes 55a, 55b and 55c are provided on the thick portions of the n-type gallium arsenide film 53. Interconnections 56a and 56b provide current paths between the switching transistors ST and the memory transistors MT.

A process sequence for fabricating the non-volatile programmable read only memory device shown in FIG. 10 is similar to the process for the second embodiment until the high-purity intentionally undoped gallium arsenide film, the heavily doped n-type aluminum gallium arsenide film and the heavily doped n-type gallium arsenide film are epitaxially grown on the semi-insulating gallium arsenide substrate 51.

Figure 11A:
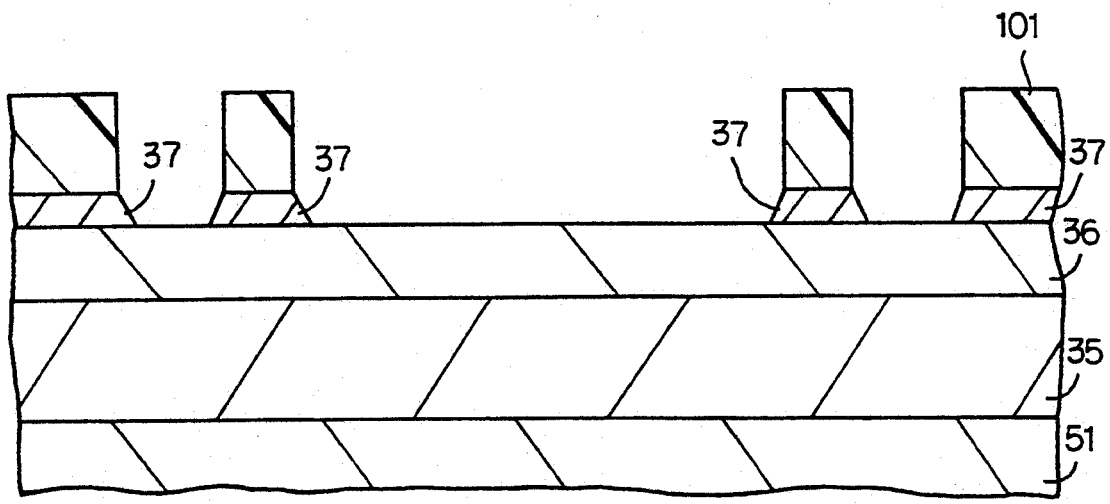
FIGS. 11A to 11C are cross sectional view showing essential steps of a process sequence for fabricating the non-volatile programmable read only memory device shown in FIG. 10.

An appropriate mask layer 101 is formed on the heavily doped n-type gallium arsenide film through a lithographic process, and the heavily doped n-type gallium arsenide film is partially removed to form the heavily doped n-type gallium arsenide blocks 37 as shown in FIG. 11A.

Figure 11B:
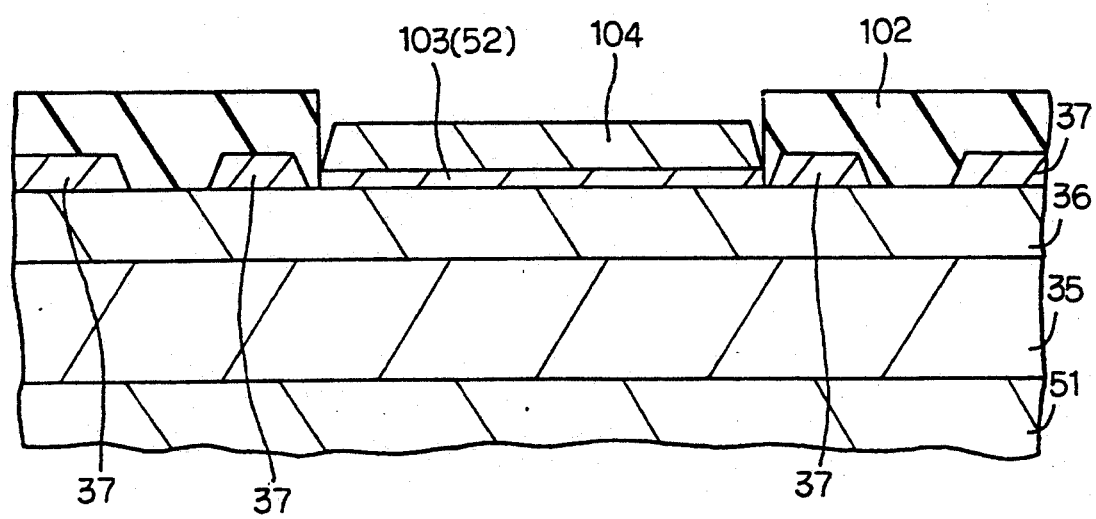

The mask layer 101 is stripped off, and silicon dioxide is deposited over the entire surface of the structure by using a chemical vapor deposition, and the silicon dioxide film is patterned through a lithographic process so that a mask layer 102 of silicon dioxide covers the heavily doped n-type gallium arsenide blocks 37. Using the mask layer of silicon dioxide, a p-type gallium arsenide film 103 and an n-type gallium arsenide film 104 are epitaxially grown on the exposed surface of the heavily doped n-type aluminum gallium arsenide layer 36. The selective growth of the gallium arsenide films 103 and 104 is achieved by using a molecular beam epitaxy or a metal organic vapor phase growing technique. The resultant structure of this stage is shown in FIG. 11B.

Figure 11C:
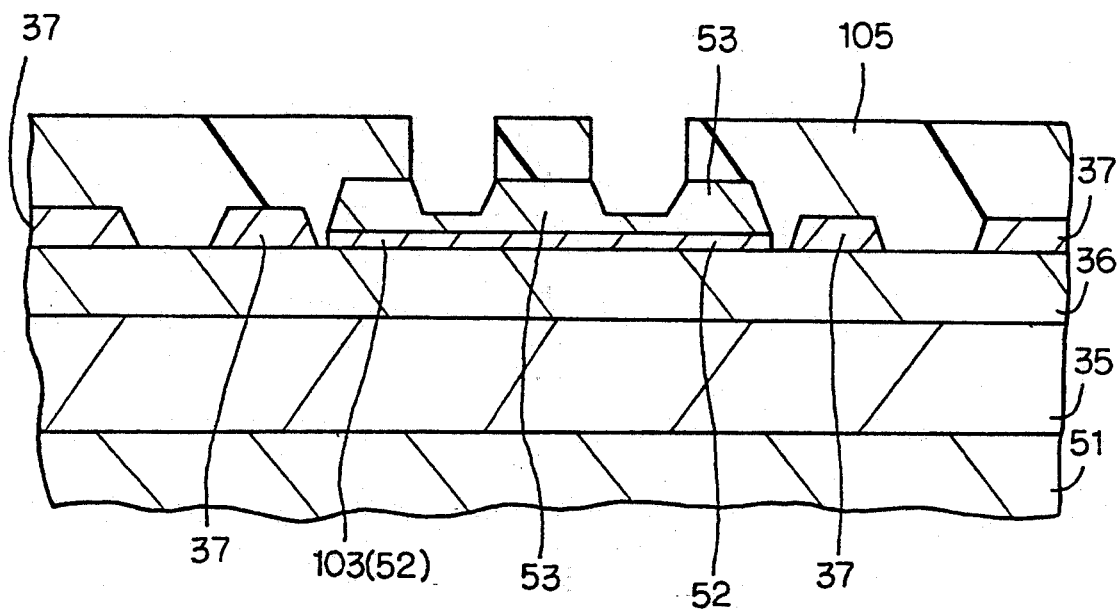

After the selective growth, the mask layer of silicon dioxide 102 is removed from the structure, and another mask layer 105 is formed on the structure. The mask layer 105 exposes predetermined regions of the n-type gallium arsenide film 104 to an etchant, and shallow recesses are formed in the n-type gallium arsenide film 104 or 53 as shown in FIG. 11C.

After the mask layer 105 is stripped off, the non-volatile programmable read only memory device is completed through similar processes to the first embodiment, and, for this reason, detailed description is omitted for the sake of simplicity.

All the advantages of the second embodiment is also achieved by the third embodiment. Since the switching transistors ST are of the MES type field effect transistor, no I-V collapse takes place in the switching transistor, and the channel width of the switching-transistor ST is not increased for preventing the switching transistor ST from the I-V collapse.

Although particular embodiments of the present invention have been shown and described, it will be obvious to those skilled in the art that various changes and modifications may be made without departing from the spirit and scope of the present invention. For example, the threshold voltage level may be regulated to a certain level lower or higher than $-0.8$ volt depending upon the associated circuits, and x of $Al_xGa_{1-x}As$ may be adjusted to any value except for 0.3.

What is claimed is:

1. A non-volatile programmable read only memory device fabricated on a substrate, comprising:
    a plurality of non-volatile programmable memory cells, each of said non-volatile programmable memory cells comprising a) a channel layer of an intentionally undoped first compound semiconductor material, b) a carrier supplying layer formed on said channel layer and of a heavily doped second compound semiconductor material having a deep energy level serving as trapping centers and capable or modulating channel conductivity by trapping hot carriers injected from said channel layers and c) a gate electrode formed on said carrier supplying layer, a source and drain being located on opposite sides of said gate electrode, in which said deep energy level causes a current-voltage collapse phenomenon to take place due to trapping said hot carriers injected from said channel layer to said carrier supplying layer in the presence of a first stress voltage applied to said drain with respect to said gate electrode for decreasing channel conductivity, and in which a second stress voltage identical in polarity with said first stress voltage and applied to said drain with respect to said gate electrode ionizes said deep energy level so as to allow recovering from said current-voltage collapse phenomenon.

2. A non-volatile programmable ready only memory device as set forth in claim 1, in which said channel layer, said carrier supplying layer, said gate electrode, said source and said drain as a whole constitute a memory transistor for storing a data bit, wherein a word line and a bit line are respectively coupled to said gate electrode and said drain.

3. A non-volatile programmable ready only memory device as set forth in claim 2, in which said first and second compound semiconductor materials are gallium arsenide and aluminum gallium arsenide doped with n-type impurity atoms, respectively.

4. A non-volatile programmable ready only memory device fabricated on a substrate, comprising:
    a plurality of non-volatile programmable memory cells, each of said non-volatile programmable memory cells comprising:
    a) a channel layer of an intentionally undoped first compound semiconductor material,
    b) a carrier supplying layer formed on said channel layer and of a heavily doped second compound semiconductor material having a deep energy level serving as trapping centers and capable of modulating channel conductivity by trapping hot carriers injected from said channel layers, and
    c) a gate electrode formed on said carrier supplying layer, a source and drain being located on opposite sides of said gate electrode, in which said deep energy level causes a current-voltage collapse phenomenon to take place due to trapping said hot carriers injected from said channel layer to said carrier supplying layer in the presence of a first stress voltage applied to said drain with respect to said gate electrode for decreasing channel conductivity, and in which a second stress voltage identical in polarity with said first stress voltage and applied to said drain with respect to said gate electrode ionizes said deep energy level so as to allow recovering from said current-voltage collapse phenomenon, wherein
    said channel layer, said carrier supplying layer, said gate electrode, said source and said drain as a whole constitute a memory transistor operative in a depletion mode for storing a data bit, said source being coupled to said gate electrode, each of said non-volatile programmable memory cells further comprising a switching transistor coupled between said memory transistor and a bit line and having a gate electrode coupled to a word line.

5. A non-volatile programmable read only memory device as set forth in claim 4, in which said switching transistor is operative in an enhancement mode.

6. A non-volatile programmable read only memory device as set forth in claim 5, in which said first and second compound semiconductor materials are gallium arsenide and aluminum gallium arsenide doped with n-type impurity atoms, respectively.

7. A non-volatile programmable read only memory device as set forth in claim 6, in which said carrier supplying layer includes a thick portion and a thin portion, and in which the gate electrode of said memory transistor and the gate electrode of said switching transistor are respectively formed on said thick and thin portions.

8. A non-volatile programmable read only memory device as set forth in claim 5, in which said switching transistor is implemented by a metal-semiconductor field effect transistor.

9. A non-volatile programmable ready only memory device as set forth in claim 8, in which said first and second compound semiconductor materials are gallium arsenide and aluminum gallium arsenide doped with n-type impurity atoms, respectively, and in which said metal-semiconductor field effect transistor comprises a p-type gallium arsenide film formed on said carrier supplying layer, and an n-type gallium arsenide film on said p-type gallium arsenide film and having a recess, the gate electrode of said metal-semiconductor field effect transistor being held in contact with said n-type gallium arsenide film defining the bottom surface of said recess.

* * * * *